United States Patent [19]

Wegmann

[11] Patent Number: 4,748,935
[45] Date of Patent: Jun. 7, 1988

[54] VAPOR SOURCE FOR VACUUM COATING INSTALLATION

[75] Inventor: Urs Wegmann, Oberschan, Switzerland

[73] Assignee: Balzers Aktiengesellschaft, Liechtenstein, Switzerland

[21] Appl. No.: 825,075

[22] Filed: Jan. 31, 1986

[30] Foreign Application Priority Data

Feb. 5, 1985 [CH] Switzerland ............... 00509/85

[51] Int. Cl.⁴ ............................................. C23C 14/00
[52] U.S. Cl. ................................. 118/723; 118/727; 118/50
[58] Field of Search ............... 427/35; 118/723, 727, 118/726, 50

[56] References Cited

U.S. PATENT DOCUMENTS

| | | | |
|---|---|---|---|
| 2,435,997 | 2/1948 | Bennett | 118/727 |
| 4,115,653 | 9/1978 | Kienel et al. | 118/726 |
| 4,221,629 | 9/1980 | Zollinger | 159/28.1 |
| 4,620,081 | 10/1986 | Zeren | 118/726 X |

Primary Examiner—Richard R. Bueker
Assistant Examiner—Alain Bashore
Attorney, Agent, or Firm—McGlew and Tuttle

[57] ABSTRACT

A vapor source for a vacuum-coating installation comprises a rotatably mounted vaporizing crucible, a drive motor and a device, preferably an electron beam gun, for heating the material to be vaporized, all arranged in one structural unit, movable as a whole in the coating installation. With this, the site of the vaporization for a given layer-thickness distribution can be selected optimally to correspond to the respective applications.

4 Claims, 1 Drawing Sheet

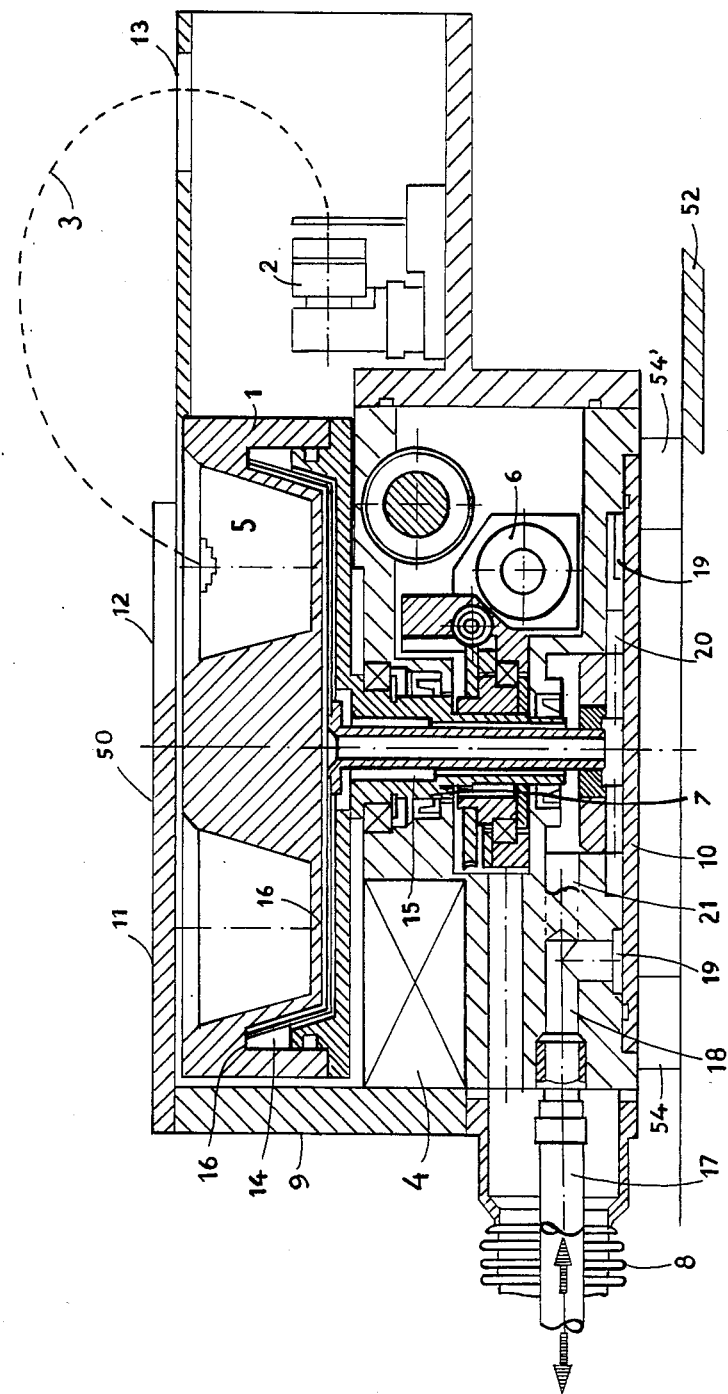

VAPOR SOURCE FOR VACUUM COATING INSTALLATION

FIELD AND BACKGROUND OF THE INVENTION

The present invention relates, in general, to vacuum-coating and in particular to a new and useful vapor coating device in which the carrier of the vapor-emitting material is constructed so as to be rotatable and driven by a motor by means of a transmission mechanism.

Vapor sources, for which the carrier of the vapor-emitting material, for example, a melting crucible for the material to be vaporized, is constructed so as to rotate are known. The German Auslegeschrift No. 1,521,525, for example, shows how to make a vaporizing crucible rotate for the purpose of holding the molten, vaporizable material by centrifugal force on the interior of the vaporizing crucible. The surface of the melt attain a desired shape due to the centrifugal force, and focussing of the vaporized particles is possible. Also, the distribution of the vapor, condensing the substrate, can be influenced. It is a further advantage that, due to the paraboloid shape of the surface of the melt bath as the crucible is rotating, the surface area and, with it, the emission of vapor is increased.

It has also already been proposed to influence the distribution of the coating material through the choice of the rotational speed of a vaporizing crucible, this process offering the advantage that the distribution curve can be altered and adapted to particular conditions by changing the rotational speed even during the vapor-coating process itself.

A further advantage with rotatable crucibles is described in the German Offenlegungschrift No. 3,316,554. In this arrangement, the crucibles are combined with a crucible-changing device and the crucible, which is in the vaporizing position, can be caused to rotate by a shaft connected to it. Vaporizing installations, with a device for rotating the material to be vaporized during the vaporizing process, are also described in the British Patent No. 1,318,046, the German Offenlegungsschrift No. 3,010,925 and the German Offenlegungsschrift No. 2,616,215. For the arrangement described in the last-mentioned reference, the material to be vaporized can additionally be moved in the vertical direction of the axis of rotation, that is, its height can be adjusted.

For all the arrangements mentioned, the motor was usually arranged outside of the vaporizing chamber and the rotational motion was introduced into the vacuum by means of a sealed shaft. Because the shaft was passed through the wall, the vaporizer itself was fixed in the vacuum chamber, with the exception that the height could be adjusted.

FIG. 7 of German Auslegeschrift No. 1,521,525, however, shows the possibility of making the rotary transmission lead through in a tiltable fashion, so that the shaft can be tilted to extend in different directions, adaptable to the respective requirements.

A rotatable vaporizer, which can be adjsuted in the lateral direction (perpendicular to the axis of rotation), has become known from the German Patent No. 2,849,933. The three most important components of an electron beam vaporizing device, namely the holder for the material to be vaporized, for example, a vaporizing crucible, an electron beam source and a deflecting magnet for the electron beam being mounted on a common holding rod and the holding device for the material to be vaporized being constructed as a rotating crucible with a motor, which is mounted on the same holding rod and operated in the vacuum chamber. The holding rod itself is passed vacuum-tightly through the wall of the vacuum chamber and could be moved for a suitable adjustment.

In the electronics industry, thin metal layers are frequently applied with electron beam vaporizers in the production of microswitch circuits. Electron beam vaporizers are also frequently used for the production of optical layers. For these applications, the requirements, which the vaporizing equipment must meet, are very high. In particular, exceptionally high requirements are with respect to the homogenity of the layer thickness distribution, the layer thickness reproducibility, the adherence of the vapor to a particular angular distribution, etc. The highest requirements can be fulfilled only if:

(a) the material is always vaporized from the same source location within the vaporizing chamber, the location being accurately defined, and (b) the characteristics of the dispersion of the vapor are as constant as possible.

It is well known that rotating or moving the material to be vaporized under the electron beam produces a significantly smoother vapor-deposition behavior. For low-melting metals, such as, for example, aluminum, the splash frequency is drastically reduced thereby and bath oscillations, which lead to fluctuations in the vapor dispersal are also significantly reduced. For high-melting metals, the development of holes and craters in the vaporized material, which also have a disadvantageous effect on the vapor dispersion, is avoided by rotating the crucible. For dielectrics, such as, for example, silica, or for subliming materials such as chromium, the "burning in" of holes is prevented, once again, by rotating the crucible. With this method, even large surfaces of material can be vaporized very evenly and uniformly. It is also more readily possible to keep the source location stable and small by means of the rotation; for crucibles of large diameter, this cannot be achieved with the help of beam scanning alone (wobbling).

The best results are, however, achieved when rotation and a programmed beam deflection are used together. The beam deflection then serves only for the purpose of defining an exact vaporizing zone over a small, precise region.

The rotating-crucible vaporizers, used until now, were quite expensive to operate. The driving mechanisms were in each case arranged outside of the vacuum chamber, where they were frequently in the way. The leadthroughs, required for the driving mechanism, also place an appreciable limit on possible installations. The site of the vaporization could therefore be selected only within certain limits.

The problems mentioned are particularly serious when several layers must be applied in a single vapor-deposition process, which very frequently is the case these days. Until now, one has made do with so-called multi-hole crucibles. With such a system, the individual crucible cups can be brought consecutively into the vaporization position. This type of source permits vaporization from always the same site; however, it does not solve the problems of uniform vaporization, because there is no rotation of the crucible cups about their own axis.

SUMMARY OF THE INVENTION

The invention provides an arrangement for a vacuumcoating installation, for which the site of vaporization within the installation can be freely chosen, while at the same time, the possibility is provided of subjecting the material to be vaporized to a rotation during the vaporization process.

The inventive arrangement includes a vapor source, together with the motor, in a structural unit, which is arranged in the vacuum-deposition installation so as to be displaceable in at least two dimensions.

Preferably, the rotary drive mechanism, together wtih the actual vapor source, for example, the crucible, as well as a transmission mechanism and the associated motor are constructed as a compact structural unit. It is then possible to freely place the vaporizer in the vapor deposition chamber essentially without limitation. If several materials are to be vaporized from rotating crucibles, a corresponding number of structural units are advantageously movably arranged on carriages or on a rotating arrangement, so that, by shifting the vaporizer that has just been used, it is possible at all times to achieve the effect that the site of the vaporization always remains the same in the installation. Of course, different vaporizing sites can also be chosen for the individual vaporization processes, when this appears to be appropriate. Moreover, good layer thickness distribution can be achieved even on large substrate surfaces, such as, for example, cylinder drums, by constantly moving the vaporizer during the vapor-deposition process.

An embodiment in which the structural unit contains an electron-beam generating device for heating the material to be vaporized, is particularly recommended. At the same time, a device for focusing the electron beam on the material to be vaporized and means for influencing the location and the size of the focus is provided.

The vacuum-light encapsulating of the transmission mechanism and of the drive motor belonging to a structural unit, as a result of which the emission of gases into the vapor-deposition vacuum can be reduced to minimum, is also recommended. The drive underlies an electric motor, or a motor driven by a fluid medium. The supply lines for the motor and for the cooling system, which is generally required, that is, electrical cables and appropriate pipelines for the supply and removal of a driving medium and a coolant advantageously comprise a flexible hose which can be connected in the interior of the vapor depositing installation with an appropriate connection for the current and the media. It has turned out that such a flexible supply hose hardly impairs working with such a coating installation. Above all, it also ensures that exchanges can be made easily and rapidly, because the appropriate connection with supply lines can easily be detached in case of need.

When larger vaporizers are used, which are combined with a motor into one structural unit, it may be appropriate to facilitate the movement in the interior of the coating installation even further by mounting the individual structural units on a movable frame, so that they can be dirven to a suitable location on the base of a larger coating installation without expenditure of much power.

Accordingly, it is an object of the invention to provide a vaporizer unit for use in vacuum coating, which may be positioned at any selected location in a vacuum chamber housing which is to be employed for coating materials with a vaporizable substance.

A further object of the invention is to provide a vaporizer unit construction which includes a closed housing having a rotatable shaft carrying a crucible which has one or more recesses on its top surface which are exposed to action by an electron beam producer also carried within the housing.

A further object of the invention is to provide a vaporizer unit for use in vacuum coating which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

BRIEF DESCRIPTION OF THE DRAWING

The only FIGURE of the drawing is a transverse sectional view of a vaporizer housing constructed in accordance with the invention.

GENERAL DESCRIPTION OF THE PREFERRED EMBODIMENTS

Referring to the drawing, in particular, the invention embodied therein comprises a vaporizer unit 50 for positioning in a vacuum chamber housing 52 and which may be positioned on support elements or track 54,54' for selective positioning in any desired location within the vacuum chamber housing 52.

In accordance with the invention, the vaporizer unit 50 includes a housing 9 enclosing and carrying a rotatable support shaft 7 having a crucible 1 connected thereto for rotation therewith and which has at least one open vaporizable material receiving recess in which vaporizer material 5 is positioned. Drive means in the housing 9 includes a drive motor 6 driving the shaft 7 through a transmission connected between the motor 6 and the shaft 7. In addition, the vaporizer unit 50 includes an electron beam producer 2 producing an electron beam 3 which acts on the material 5 and which is guided advantageously by a magnet 4.

The FIGURE shows the vaporizer 50 which comprises a structural unit including the rotatable vaporizing crucible 1, the device 2 for producing the electron beam 3 for heating the vaporizing crucible, the magnet 4 for producing a magnet field that diverts the electron beam onto the material 5, which is to be used in the crucible, as well as the motor 6 with the transmission for driving a hollow vertical shaft 7 that supports the crucible. The structural unit is connected by supply lines to supply the necessary electrical energy and a coolant, within a flexible metal hose 8, with appropriate connections in the structural unit. The unit 50 may be selectively positioned in the vacuum chamber housing 52 on track 54, 54'. The structural unit is enclosed by the housing 9, which has a base 10 and a plate 11 covering the crucible, with openings 12 and 13 for the electron beam or for the outlet of the vapor produced in the crucible. The base of the crucible and, partly also, its side walls are hollow, in order to be able to pass a coolant through passages 14. The coolant is discharged through the hollow shaft 7 to and over a ring channel 15 encircling the shaft. Due to a baffle 26, mounted in the hollow space, the coolant is at first caused to flow radially outwardly from the crucible axis and then around the edge of the baffle, radially inwardly.

The coolant supplied passes through a bore hole 18 into an annular space 19 and, from there, through an annular chamber 20 into the hollow shaft 7. The coolant then comes back through the annular chamber 15 from the cooling chamber of the crucible and it is discharged through a further annular chamber and bore hole 21 through a discharge line, which lies behind the feed line 17 and is therefore not visible in the drawing.

Further details concerning the supply and discharge of the coolant can be seen in the drawing. They are, however, of no importance for the essence of the inventive concept and can be modified in many ways. The drawing shows several ring seals for the coolant channels as well as ball bearings for the drive shaft of the crucible. In supply hose 8, only the feed line 17 for the coolant, lying at the front is seen, not however the discharge line lying behind it, nor the electrical lines supplying energy to the motor and to the device for producing the electron beam.

The crucible driving mechanism can also be modified in various ways from the design shown in the drawing. A transmission mechanism is not always required; under some circumstances, a slow-speed motor can be coupled directly to the crucible shaft. In some application cases, however, a very slow rotation is desirable.

The technical details of an electron-beam generating device and of the deflecting magnet are known as such and do not form an object of the present invention.

Inventive vapor sources can be used to advantage, above all with larger coating installations, when it is necessary to provide several vapor sources, for example, for coating larger areas uniformly, and when the site of the vaporization is to be changed from case to case, in some cases even during the coating process, depending on the objects to be coated. Since each inventive vapor source forms a structural unit, it can be moved as a whole in the installation to the site, which is suitable at the time. Any devices that may be required to move the structural unit, such as, for example, rails, traction cables, etc. can be provided in a manner appropriate to the purpose and are to be adapted to the particular application.

While a specific embodiment of the invention has been shown and described in detail to illustrate the application of the principles of the invention, it will be understood that the invention may be embodied otherwise without departing from such principles.

What is claimed is:

1. A vaporizer unit for positioning in a vacuum chamber housing, comprising a vaporizer housing, a rotatable support shaft mounted within said housing, a rotatable crucible connected to said shaft for rotation therewith and having at least one open vaporizable material receiving recess thereon, drive means in said housing connected to said shaft for rotating said shaft, an electron beam producer in said housing for acting on the vaporizable material within said crucible, a magnet in said housing for directing an electron beam from said electron beam producer to said crucible, and a flexible conduit connected to said housing for passage of a cooling material and for electrical connections, said flexible conduit defining a passageway therethrough for a coolant and electrical conduit feed lines, means in said housing for distributing a coolant to the vicinity of said crucible, said housing including a laterally extending portion carrying said electron beam producer on one side of said rotating crucible, said magnet being carried below said crucible positioned to focus the electron beam producer so as to direct the beam to the vaporizable material in said crucible.

2. A vaporizer unit according to claim 1, including, in combination with said vaporizer unit, a vacuum chamber housing defining an interior space, said vaporizer housing being positioned in said interior space, at least one track connected to said vacuum chamber housing and extending in said space, said vaporizer housing being mounted for movement on said track to a plurality of positions in said space, said flexible conduit extending through said vacuum chamber housing.

3. A vaporizer unit combination according to claim 2, wherein said shaft is hollow, said vaporizer housing defining a plurality of annular chambers communicating with said passageway for the coolant, said annular chambers communicating with a hollow interior space of said shaft for circulating coolant to said crucible.

4. A vapor source apparatus comprising a vacuum chamber housing defining an interior space for a vacuum, track means in said vacuum chamber housing defining a path in said space, a vaporizer housing mounted for movement along said track means to a plurality of desired positions in said vacuum chamber housing, a shaft rotatably mounted to said vaporizer housing, a crucible having a plurality of vaporizable material receiving recess therein connected to said shaft for rotation with rotation of said shaft, a motor mounted in said vaporizer housing and operatively connected to said shaft for rotating said shaft, coolant passage means in said housing for defining a coolant passage in said housing for cooling said crucible, vaporizing means mounted in said housing for acting on the vaporizable material to vaporize it, a flexible hose connected between said vaporizer housing and said vacuum chamber housing for permitting movement of said vaporizer housing in said vacuum chamber housing, coolant lines in said flexible hose connected to said coolant passage means for supplying coolant to and removing coolant from said coolant passage means, and power supply means connected to said motor and extending through said flexible hose for powering said motor to rotate said shaft and crucible.

* * * * *